(12) United States Patent
Ouellette et al.

(10) Patent No.: US 6,993,692 B2
(45) Date of Patent: Jan. 31, 2006

(54) METHOD, SYSTEM AND APPARATUS FOR AGGREGATING FAILURES ACROSS MULTIPLE MEMORIES AND APPLYING A COMMON DEFECT REPAIR SOLUTION TO ALL OF THE MULTIPLE MEMORIES

(75) Inventors: Michael R. Ouellette, Westford, VT (US); Gustavo Enrique Tellez, Essex Junction, VT (US); Paul Steven Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 395 days.

(21) Appl. No.: 10/604,195

(22) Filed: Jun. 30, 2003

(65) Prior Publication Data

US 2004/0268198 A1    Dec. 30, 2004

(51) Int. Cl.
*G11C 29/00*   (2006.01)
*G06F 11/00*   (2006.01)

(52) U.S. Cl. .......................... 714/723; 714/738; 714/5
(58) Field of Classification Search ...................... None
See application file for complete search history.

(56) References Cited

U.S. PATENT DOCUMENTS

| | | |
|---|---|---|
| 4,333,142 A | 6/1982 | Chesley |
| 5,222,066 A | 6/1993 | Grula et al. |
| 5,388,104 A | 2/1995 | Shirotori et al. |
| 5,475,815 A | 12/1995 | Byers et al. |
| 5,535,164 A | 7/1996 | Adams et al. |
| 5,617,531 A | 4/1997 | Crouch et al. |
| 5,835,502 A | 11/1998 | Aipperspach et al. |
| 5,974,579 A | 10/1999 | Lepejian et al. |
| 5,995,731 A | 11/1999 | Crouch et al. |
| 6,085,346 A | 7/2000 | Lepejian et al. |
| 6,163,490 A * | 12/2000 | Shaffer et al. ............... 365/200 |
| 6,209,074 B1 * | 3/2001 | Dell et al. .................. 711/170 |
| 6,360,342 B1 | 3/2002 | Lee et al. |
| 6,446,184 B2 * | 9/2002 | Dell et al. .................. 711/170 |
| 2002/0046377 A1 | 4/2002 | Kniffler et al. |
| 2002/0174394 A1 | 11/2002 | Ledford et al. |
| 2003/0016578 A1 | 1/2003 | Janik et al. |

* cited by examiner

*Primary Examiner*—Christine T. Tu
(74) *Attorney, Agent, or Firm*—Robert A. Walsh; Dillon & Yudell LLP

(57) ABSTRACT

An integrated circuit includes a plurality of separate memory arrays each having a respective one of a plurality of inputs and a respective one of a plurality of outputs. Each output provides an output value indicative of whether a storage location associated with an applied address is passing or failing. The integrated circuit further includes a shared built-in self-test (BIST) and repair system coupled to all of the plurality of inputs and all of the plurality of outputs. The shared BIST and repair system applies addresses and data to the plurality of inputs to test the plurality of memory arrays for failing storage locations. In response to detection of a failing storage location in any of the plurality of memory arrays, the shared BIST and repair system applies a common address remapping to all of the plurality of memory arrays to remap, in each memory array, the address associated with the failing storage location to a different storage location

21 Claims, 4 Drawing Sheets

METHOD, SYSTEM AND APPARATUS FOR AGGREGATING FAILURES ACROSS MULTIPLE MEMORIES AND APPLYING A COMMON DEFECT REPAIR SOLUTION TO ALL OF THE MULTIPLE MEMORIES

BACKGROUND OF INVENTION

1. Technical Field

The present invention relates in general to integrated circuitry and, in particular, to integrated circuits including multiple memory arrays. Still more particularly, the present invention relates to the aggregation of detected failures across multiple memory arrays and the application of a common repair solution to all of the multiple memory arrays.

2. Description of the Related Art

As integrated circuit technology has advanced, the complexity and density of circuit devices formed within a single integrated circuit (IC) has increased dramatically. Consequently, several problems have arisen with regard to testing ICs. For example, while the conventional methodology for testing a memory array within an IC may be relatively straight forward, ICs typically have far fewer I/O pins available to an external circuit tester than are required to adequately test the memory array.

A general solution to the above-described and other difficulties with external testing is to imbed test circuitry within an IC itself. Such integrated testing facilities are frequently referred to as built-in self-test (BIST), array self-test (AST), or array built-in self-test (ABIST) circuits and will hereinafter be referred to generically as BIST circuits.

Although the integration of BIST circuits within ICs facilitates IC testing, a central concern associated with BIST circuits is the large amount of die size consumed by the BIST circuit and associated circuitry. This concern is magnified as the number of memory arrays and other subcircuits integrated within an IC that require BIST testing multiply. This concern is particularly significant for state-of-the-art integrated circuits, such as a microprocessors and Application-Specific Integrated Circuits (ASICs), which commonly contain hundreds or thousands of relatively small memory arrays each requiring BIST testing.

SUMMARY OF INVENTION

The present invention introduces an improved integrated circuit and associated BIST testing and repair methodology that minimize integrated circuit die area devoted to BIST and associated repair circuitry by applying a common error detection and repair technique to multiple embedded memory arrays.

In one embodiment, an integrated circuit includes a plurality of separate memory arrays each having a respective one of a plurality of inputs and a respective one of a plurality of outputs. Each output provides an output value indicative of whether a storage location associated with an applied address is passing or failing. The integrated circuit further includes a shared built-in self-test (BIST) and repair system coupled to all of the plurality of inputs and all of the plurality of outputs. The shared BIST and repair system applies addresses and data to the plurality of inputs to test the plurality of memory arrays for failing storage locations. In response to detection of a failing storage location in any of the plurality of memory arrays, the shared BIST and repair system applies a common address remapping to all of the plurality of memory arrays to remap, in each memory array, the address associated with the failing storage location to a different storage location.

All objects, features, and advantages of the present invention will become apparent in the following detailed written description.

BRIEF DESCRIPTION OF DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION

Figure 1:
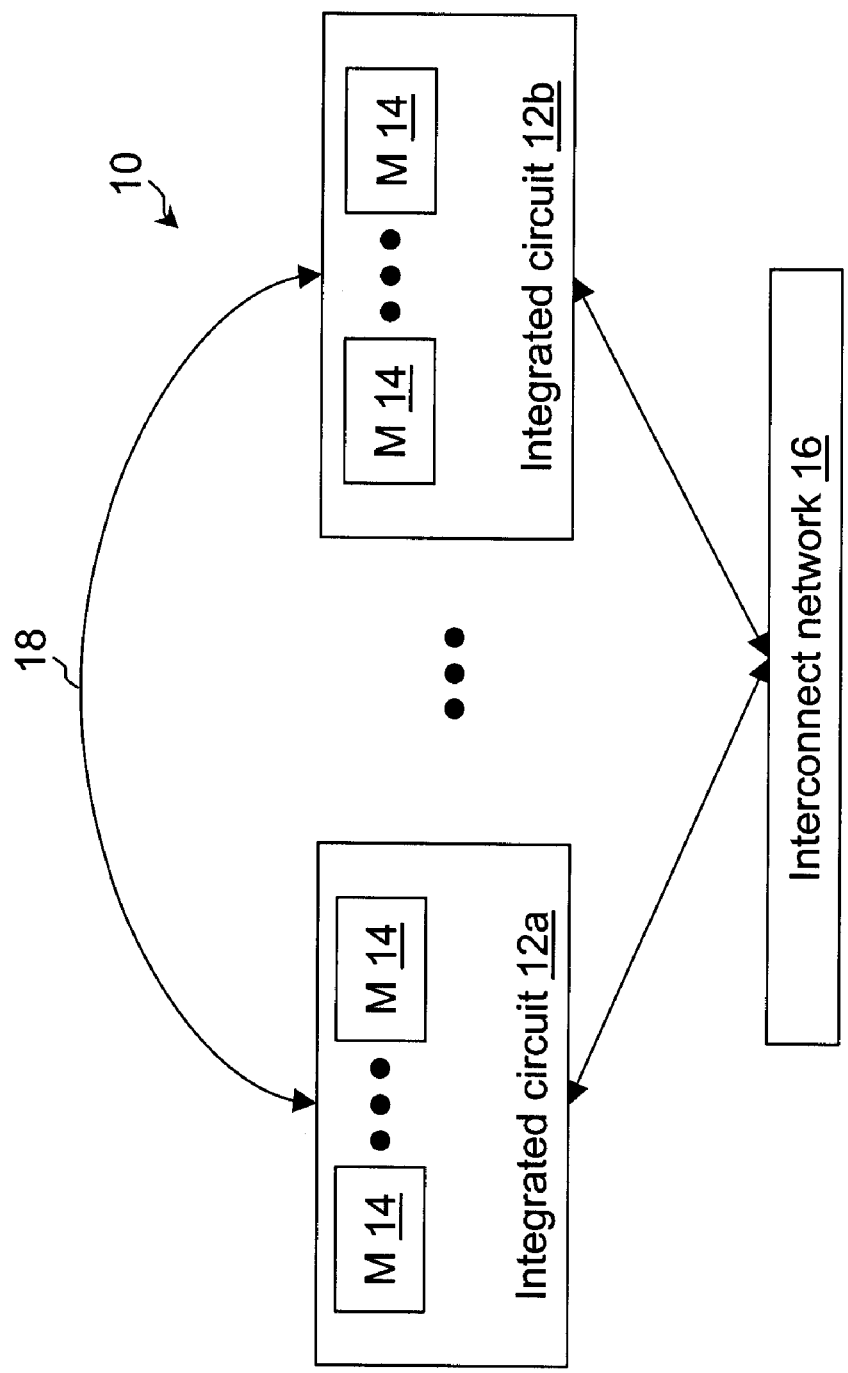
FIG. 1 is a high-level block diagram of an electronic system in which the present invention may be implemented.

With reference now to the figures and, in particular, with reference to FIG. 1, there is illustrated a high-level block diagram of an electronic system in accordance with the present invention. Electronic system 10 may comprise, for example, a computer system, a network device, an electronic appliance, or any of a myriad of other well-known or future developed electronic systems containing integrated circuitry.

As shown, electronic system 10 includes multiple integrated circuit chips 12, which are interconnected for communication through direct connections 18 and/or an interconnect network 16. In various embodiments of electronic system 10, direct connections 18 and interconnect network 16 may comprise, for example, metal wiring or traces, buses, switches, cabling, and/or wireless radio frequency or infrared communication links, and the like.

At least one and possibly numerous integrated circuits 12 include multiple memories (M) 14 for storing data. Memories 14 may be implemented, for example, as Dynamic Random Access Memory (DRAM) or Static Random Access Memory (SRAM), as is known in the art. In different integrated circuits 12, memories 14 may function, for example, as cache memories, communication buffers, register files, queues, stacks, etc.

Figure 2:
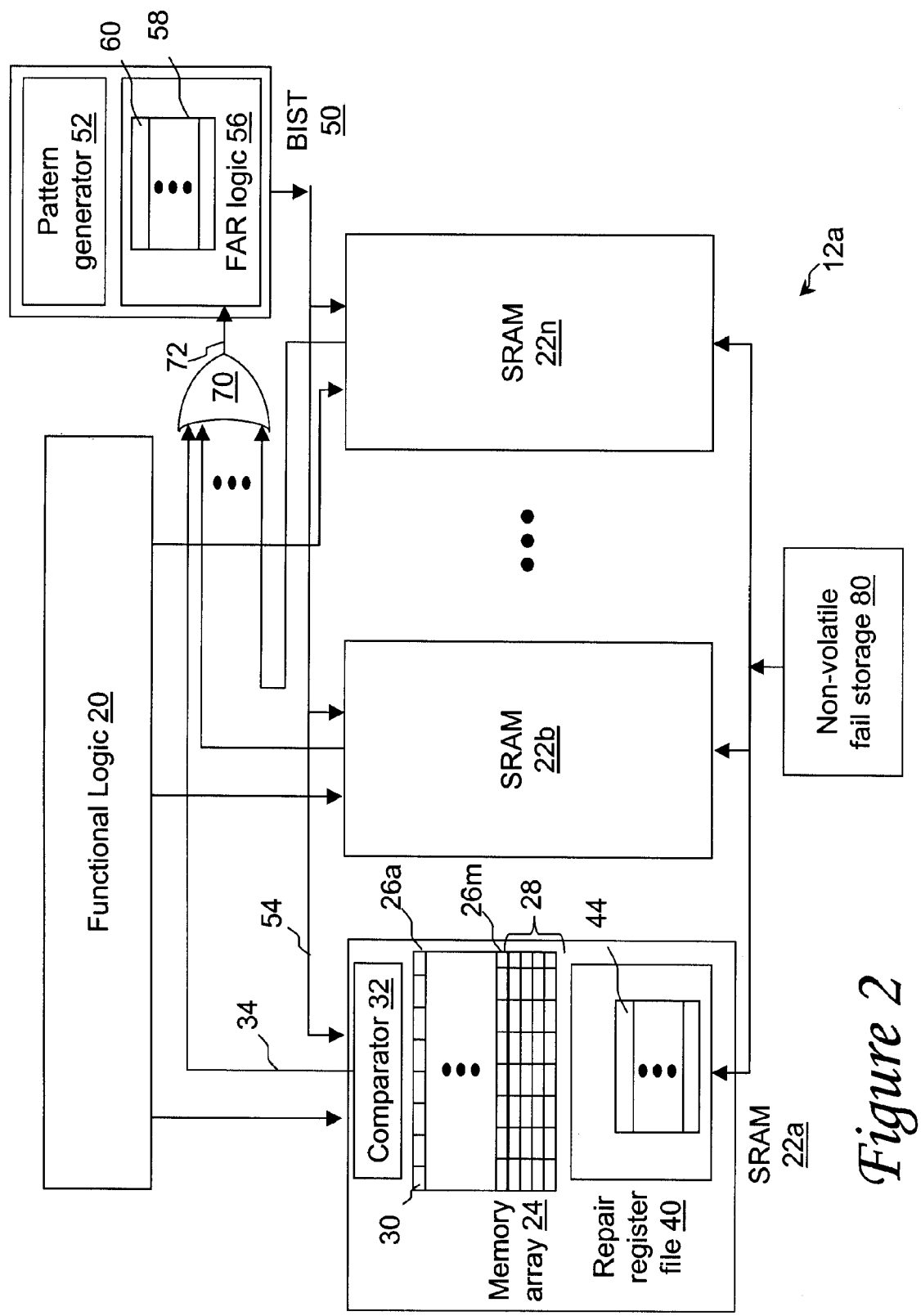
FIG. 2 is a high-level block diagram of a first exemplary embodiment of an integrated circuit in accordance with the present invention.

Referring now to FIG. 2, there is depicted a high-level block diagram of an integrated circuit 12a in accordance with the present invention. As illustrated, integrated circuit 12a includes functional logic 20, which performs the "work" of integrated circuit 12a. For example, functional logic 20 may include a hardware state machine, an arithmetic logic unit (ALU), instruction sequencing logic, and/or other types of integrated circuitry, the precise details of which are not germane to the present invention. In performing its intended function(s), functional logic 20 consumes and/or produces data, which may represent, for example, data values, instructions, packet headers, control and state information, etc.

To support the consumption and production of data by functional logic 20 at low access latencies, integrated circuit 12a further includes multiple embedded memories 22a–22n, which in the depicted embodiment are implemented as SRAMs. As shown, each SRAM 22 includes a respective memory array 24 having associated therewith control circuitry, buffers, address decoders, sense amplifiers and other conventional peripheral circuitry (not explicitly illustrated) utilized to access memory array 24. Each memory array 24 includes multiple rows 26a–26m of storage locations (memory cells) 30, which are selectively accessible by supplying memory 22 with an address that, when decoded, corresponds to the row 26 and column of the desired storage location. In addition to rows 26a–26m, each memory array 24 includes a set of replacement rows 28, which can each be substituted for a row 26 containing one or more defective storage locations 30, as discussed further below. Although SRAMs 22 are preferably identical, it should be understood that integrated circuit 12a may include many other embedded memories that differ from SRAMs 22 in size, technology, and other characteristics.

Each SRAM 22 also contains a comparator 30 coupled to the memory array 24. Comparator 30 compares a data value read from a storage location 30 in memory array 24 with an expected data value and generates a 1-bit individual pass/fail indication 34 indicating whether the actual and expected data values matched ("0") or failed to match ("1"). In alternative embodiments, a pass/fail indication may alternatively be provided by outputting the actual data value read out of memory array 24 for subsequent comparison by BIST circuitry.

Each SRAM 22 finally includes a repair register file (RRF) 40 that supports replacement of rows 26 containing defective storage locations 30. RRF 40 includes a number of repair registers 44, which each corresponds to a respective one of replacement rows 28. In order to substitute a replacement row 28 for one of rows 26, the repair register 44 corresponding to the replacement row 28 is loaded with the row address portion of a memory address identifying the row 26 to be replaced. When a memory address containing the row address portion is subsequently received, the replacement row 28 is accessed in lieu of the identified row 26 pursuant to the address remapping contained in RRF 40.

Integrated circuit 12a further includes a shared BIST circuit 50 that is utilized to concurrently test the memory arrays 24 of all of SRAMs 22. Because a single BIST circuit 50 is utilized to test multiple memories, the die area within integrated circuit 12a devoted to test circuitry is reduced compared to prior art designs employing a separate BIST circuit for each embedded memory. As will be appreciated, the reduction in die area consumed by BIST circuitry is particularly significant for integrated circuits containing multiple small memories because the die area "overhead" associated with BIST circuit 50 can then be justified by the aggregate size of multiple memories 22.

Although many conventional BIST circuits can be employed, exemplary BIST circuit 50 includes a pattern generator 52, which supplies test address and data patterns to SRAMs 22 via bus 54, and FAR logic 56. FAR logic 56 of BIST circuit 50 includes a FAR register file 58 containing a number of FARs 60 equal to the number of replacement rows 28 in each SRAM 22. Each FAR 60 can store one common address remapping to be applied to all of SRAMs 22 to repair a detected defect, as discussed below. FAR logic 56 detects a defect for a test address generated by pattern generator 52 in response to assertion of a composite pass/fail indication 72 by an OR gate 70 that logically combines individual pass/fail indications 34.

Integrated circuit 12a finally includes non-volatile fail storage 80 for storing address remappings utilized to remap addresses originally assigned to rows 26 in which a defective storage location was found in any SRAM 22. Non-volatile fail storage 80 may be implemented, for example, utilizing conventional laser-programmable fuses or electrically programmable storage, such as Programmable Read-Only Memory (PROM) or Electrically Erasable Read-Only Memory (EEPROM). In embodiments in which electrically programmable storage is employed, FAR register file 58 can optionally be eliminated from FAR logic 56, and FAR logic 56 can store remappings to correct detected defects directly in non-volatile fail storage 80.

Figures 3A, 3B:
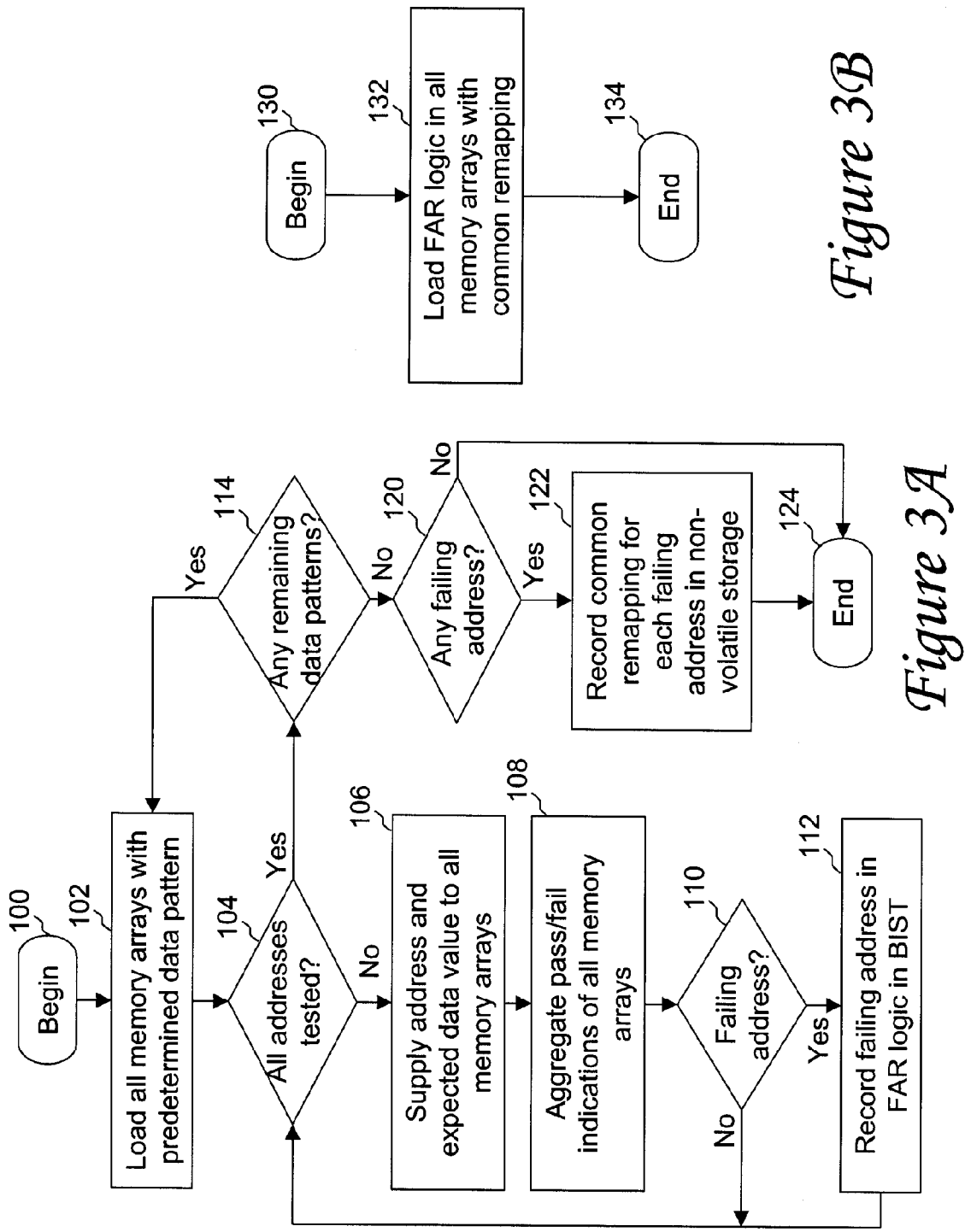
FIG. 3A is a high-level logical flowchart of an exemplary method of testing an integrated circuit and developing a common repair solution for a detected defect in accordance with the present invention.
FIG. 3B is a high-level logical flowchart of an exemplary method of applying the common repair solution to multiple memory arrays in accordance with the present invention.

With reference now to FIG. 3A there is illustrated a high level logical flowchart of an exemplary process for concurrently testing multiple memories in an integrated circuit for array defects in accordance with the present invention. To promote understanding, the process is described with reference to integrated circuit 12a of FIG. 2.

As shown, the process begins at block 100 and thereafter proceeds to block 102, which illustrates pattern generator 52 of BIST circuit 50 performing a series of memory write operations via bus 54 to load the memory array 24 of each SRAM 22 with a selected data pattern. As indicated at block 104, the process then enters a processing loop comprising blocks 104–112 in which all (or selected) memory addresses within the memory array 24 of each SRAM 22 is tested for defects. If a determination is made at block 104 that all addresses of interest have been tested for defects utilizing the current data pattern, the process passes to block 114, which is described below. However, in response to a determination at block 104 that one or more additional addresses remain to be tested utilizing the current data pattern, the process proceeds to block 106.

Block 106 depicts pattern generator 52 testing a selected memory address in each memory array 24 for a defect by asserting the selected memory address together with an expected data value on bus 54. In response to receipt of memory address at each SRAM 22, each memory array 24 outputs to the associated comparator 32 the actual data value contained in the storage location 30 identified by the selected memory address. Each comparator 32 then compares the actual data value read out from the associated memory array 24 and generates a 1-bit pass/fail indication 34 indicating whether or not the actual data value read out from the memory array 24 matches the expected data value provided by pattern generator 52. As shown at block 108, these multiple individual pass/fail indications 34 are aggregated by combination logic (e.g., OR gate 70) to produce a 1-bit composite pass/fail indication 72 that is returned to FAR logic 56 of BIST 50. If composite pass/fail indication 72 is not asserted, indicating that no SRAM 22 has a defect for the selected memory address, the process returns to block 104, which as been described. If, however, composite pass/fail indication 72 is asserted, indicating the presence of a defect for the selected memory address in the memory array 24 of at least one SRAM 22, then FAR logic 56 determines that the memory address is a failing memory address at block 110 and records the failing address (or at least the row portion thereof) in a FAR 60 in FAR register file 58, as depicted at block 112. The process then returns to block 104.

In response to a determination by BIST 50 at block 104 that all memory addresses of interest have been tested for the current data pattern, the process passes to block 114. Block 114 illustrates BIST 50 determining whether or not any additional data patterns remain to be tested. If so, the process returns to block 102, and the memory testing is repeated utilizing a different data pattern. If, however, a determination is made at block 114 that all data patterns of interest have been tested, a determination is made at block 120 by reference to FAR register file 58 whether or not any failing address has been detected. If not, no defect repair is necessary, and the process simply terminates at block 124.

If, however, at least one failing address was detected during tested, a common remapping for all of SRAMs 22 for the failing address is recorded in non-volatile storage, such as non-volatile fail storage 80. The common remapping indicates which replacement row 28 is to be associated with the failing address in each of memory arrays 24 so that subsequent memory accesses specifying the failing row address are serviced by reference to the replacement row 28 rather than the original row 26. Importantly, each common remapping applies to each of memory arrays 24, including those containing a defect in the original row 26 and those not having any defect in the original row 26. By combining defect repairs for all of SRAMs 22 in this manner, the die area allocated to the storage of defect repairs is advantageously reduced. Following block 122, the process terminates at block 124.

Those skilled in the art will appreciate that if the method of FIG. 3A is performed prior to chip deployment, the process steps illustrated at blocks 100–114 of FIG. 3A may be performed with the integrated circuit chip mounted in a chip test fixture and that the process steps depicted at blocks 120–122 may be performed at a (possibly separate) laser repair station. In other embodiments, the method of FIG. 3A may be performed either before or after chip deployment, and the process steps illustrated at blocks 120–122 may be implemented by FAR logic 56 loading an EEPROM with the common address remappings.

Referring now to FIG. 3B, there is depicted a method of repairing a set of multiple memories integrated within an integrated circuit. As illustrated, the process begins at block 130 in response to a Power On Reset (POR), reset or other control signal. As shown at block 132, in response to the control signal, non-volatile storage 80 outputs the common remapping(s) it stores to each of multiple SRAMs 22. Each common remapping is stored within a respective repair register 44 of RRF 40 in each SRAM 22 so that each defect repair is applied by all of SRAMs 22. Following block 132, the repair process terminates at block 134. Thereafter, when a memory access is made to a formerly failing address, the access is remapped to a storage location 30 within a replacement row 28 rather than the possibly defective original row 26.

Figure 4:
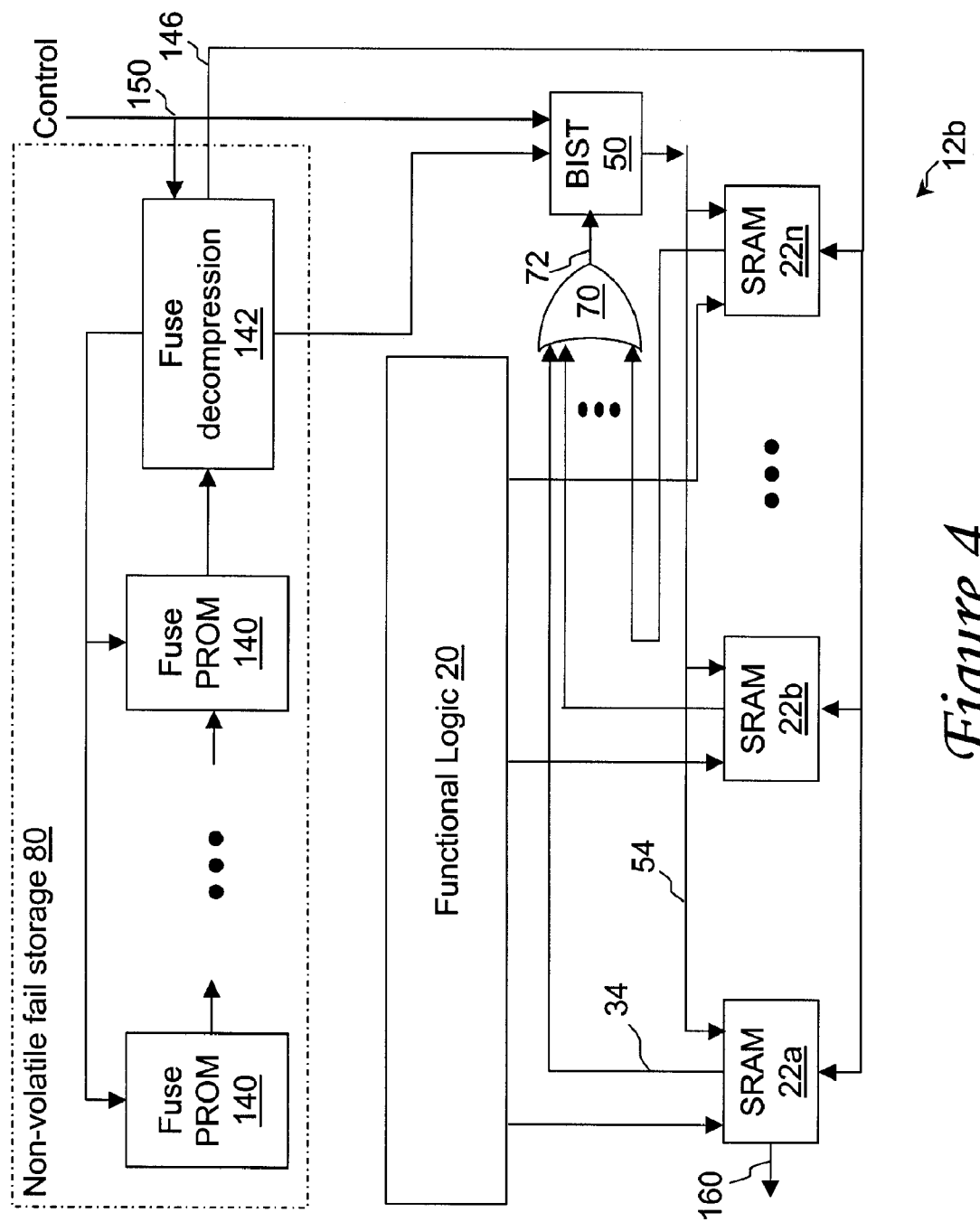
FIG. 4 is a high-level block diagram of a second exemplary embodiment of an integrated circuit in accordance with the present invention.

With reference now to FIG. 4, there is illustrated a second exemplary embodiment of an integrated circuit 12b in accordance with the present invention. As indicated by like reference numerals, integrated circuit 12b contains functional logic 20, multiple memories (e.g., SRAMs) 22, a BIST circuit 50, and combination logic (e.g., OR gate 70) as described above. FIG. 4 further depicts an implementation of non-volatile fail storage 80 in which the defect repair remappings for SRAMs 22 are compressed together with the defect repair remappings of one or more other memories for more compact storage within fuse PROMs 140.

When control (e.g., POR) signal 150 is asserted, fuse decompression logic 142 sequences accesses to fuse PROMs 140 to read out and decompress the defect repair remappings, which are transmitted in a serial stream to SRAMs 22 via serial bus 146. As described above, common remappings applicable to all of SRAMs 22 are stored by RRF 40 within each of SRAMs 22. The serial stream of defect repair remappings is also transmitted by SRAM 22a on serial bus 160 to a next memory or set of memories, which has a different set of defect repair remapping than the common remappings applied to SRAMs 22.

As has been described, the present invention provides an improved integrated circuit and method of detecting and repairing defects in embedded memory arrays. According to the present invention, detected defects are aggregated across multiple embedded memory arrays to obtain a composite list of failing addresses, and a common address remapping is applied to all of the multiple memory arrays to repair each detected defect. As a result, the die size devoted to the detection and repair of memory defects is significantly reduced.

While the invention has been particularly shown as described with reference to a preferred embodiment, it will be understood by those skilled in the art that various changes in form and detail may be made therein without departing from the spirit and scope of the invention. For example, although aspects of the present invention have been described with respect to integrated circuitry, it should be understood that present invention may alternatively be implemented as a method and program product for use with a data processing system in designing an integrated circuit or system in accordance with the present invention. Such program products, which may take the form of Verilog, VHDL, or other design language files, can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions embodying the present invention, represent alternative embodiments of the present invention.

What is claimed is:

1. An integrated circuit, comprising:
    a plurality of separate memory arrays each having a respective one of a plurality of inputs and a respective one of a plurality of outputs, each output providing an output value indicative of whether a storage location associated with an applied address is passing or failing; and
    a shared built-in self-test (BIST) and repair system, coupled to all of the plurality of inputs and all of the plurality of outputs, that applies addresses and data to the plurality of inputs to test the plurality of memory arrays for failing storage locations and, responsive to detection of a failing storage location in any of the plurality of memory arrays, applies a common address remapping to all of the plurality of memory arrays to remap, in each memory array, the address associated with the failing storage location to a different storage location.

2. The integrated circuit of claim 1, wherein the shared BIST and repair system includes:
    a pattern generator that generates data patterns to be applied to said plurality of memory arrays;
    combination logic, coupled to all of said plurality of outputs, that aggregates addresses indicated as associated with failing storage locations by said output values to obtain a composite listing of failing addresses representing all failing addresses in all of said plurality of memory arrays; and non-volatile storage, coupled to said plurality of memory arrays, that stores a common remapping for each failing address in said composite listing of failing addresses and that supplies each common remapping to all of said plurality of memory arrays.

3. The integrated circuit of claim 2, wherein:

each of said plurality of outputs provides an output value that is an individual failure indication; and said combination logic includes an OR gate that combines said plurality of outputs to produce single combined failure indication for an applied address for all of said plurality of memory arrays.

4. The integrated circuit of claim 2, wherein said non-volatile storage comprises a plurality of laser-programmable fuses.

5. The integrated circuit of claim 2, wherein said non-volatile storage comprises electrically programmable storage.

6. The integrated circuit of claim 2, wherein said non-volatile storage stores said common remapping of each failing address in compressed format.

7. The integrated circuit of claim 5, wherein:

said shared BIST and repair system is a first BIST and repair system;

said electrically programmable storage stores at least one address remapping for another memory array having a second BIST and repair system associated therewith; and one of said plurality of memory arrays includes a test output port coupled to another memory array to communicate said at least one address remapping to said another memory array.

8. The integrated circuit of claim 2, wherein said plurality of memory arrays comprises a plurality of volatile memory arrays, wherein each of said plurality of volatile memory arrays includes repair register file (RRF), coupled to said non-volatile storage, for storing each common remapping supplied by said non-volatile storage.

9. The integrated circuit of claim 1, wherein the storage location that, prior to remapping, was originally associated with the address in at least one of said plurality of memory arrays is a passing storage location.

10. The integrated circuit of claim 1, wherein said integrated circuit comprises a processor chip including data processing functional logic coupled to said plurality of memory arrays.

11. A data processing system, including:

a plurality of integrated circuit chips, including at least one processor chip in accordance with claim 10; and an interconnect network coupling said plurality of integrated circuit chips.

12. A method of detecting and providing a repair for a defect in an integrated circuit including a plurality of separate memory arrays, said method comprising:

testing each of the plurality of memory arrays to detect whether a storage location associated with an applied address is passing or failing; and in response to detection of a failing storage location in any of the plurality of memory arrays, said failing storage location being associated with a articular address, storing in non-volatile storage a common address remapping for all of the plurality of memory arrays, wherein said common address remapping indicates a remapping, in each memory array, of the particular address associated with the failing storage location to a different storage location.

13. The method of claim 12, wherein:

said testing further comprises:

generating data patterns to be applied to said plurality of memory arrays utilizing a shared pattern generator;

aggregating addresses indicated as associated with failing storage locations to obtain a composite listing of failing addresses representing all failing addresses in all of said plurality of memory arrays; and wherein said composite listing is stored in said non-volatile storage.

14. The method of claim 12, wherein said storing comprises storing said common remapping for each failing address utilizing a plurality of laser-programmable fuses.

15. The method of claim 12, wherein said storing comprises storing said common remapping for each failing address utilizing electrically programmable storage.

16. The method of claim 12, wherein said storing comprises storing said common remapping of each failing address in compressed format.

17. The method of claim 16, wherein said non-volatile storage stores at least one address remapping for another memory array other than said plurality of memory arrays; and said method further comprises forwarding said at least one address remapping from one of said plurality of memory arrays to said another memory array.

18. The method of claim 12, wherein said plurality of memory arrays comprises a plurality of volatile memory arrays, said method further comprising:

each of said plurality of volatile memory arrays storing each common remapping in respective repair register file (RRF).

19. The method of claim 12, wherein, in at least one of said plurality of memory arrays, the storage location that, prior to remapping, was associated with the particular address is a passing storage location.

20. A method of representing an integrated circuit design, said method comprising:

in one or more first design language statements, defining a plurality of separate memory arrays each having a respective one of a plurality of inputs and a respective one of a plurality of outputs, each output providing an output value indicative of whether a storage location associated with an applied address is passing or failing;

in one or more second design language statement, defining a shared built-in self-test (BIST) and repair system, coupled to all of the plurality of inputs and all of the plurality of outputs, that applies addresses and data to the plurality of inputs to test the plurality of memory arrays for failing storage locations and, responsive to detection of a failing storage location in any of the plurality of memory arrays, applies a common address remapping to all of the plurality of memory arrays to remap, in each memory array, the address associated with the failing storage location to a different storage location; and storing said one or more first design language statements and said one or more second design language statements in one or more design files.

21. A program product, comprising:

a computer usable medium;

an integrated circuit design within said computer usable medium, said integrated circuit design including:

one or more first design language statements defining a plurality of separate memory arrays each having a respective one of a plurality of inputs and a respective one of a plurality of outputs, each output providing an output value indicative of whether a storage location associated with an applied address is passing or failing; and one or more second design language statements defining a shared built-in self-test (BIST) and repair system, coupled to all of the plurality of inputs and all of the plurality of outputs, that applies addresses and data to the plurality of inputs to test the plurality of memory arrays for failing storage locations and, responsive to detection of a failing storage location in any of the plurality of memory arrays, applies a common address remapping to all of the plurality of memory arrays to remap, in each memory array, the address associated with the failing storage location to a different storage location.

* * * * *